United States Patent
Guard

(10) Patent No.: US 8,803,004 B2
(45) Date of Patent: Aug. 12, 2014

(54) COMPLEX ADHESIVE BOUNDARIES FOR TOUCH SENSORS

(71) Applicant: David Brent Guard, Southampton (GB)

(72) Inventor: David Brent Guard, Southampton (GB)

(73) Assignee: Atmel Corporation, San Jose, CA (US)

( * ) Notice: Subject to any disclaimer, the term of this patent is extended or adjusted under 35 U.S.C. 154(b) by 32 days.

(21) Appl. No.: 13/731,779

(22) Filed: Dec. 31, 2012

(65) Prior Publication Data

US 2014/0002176 A1    Jan. 2, 2014

Related U.S. Application Data

(63) Continuation-in-part of application No. 13/536,172, filed on Jun. 28, 2012.

(51) Int. Cl.
*H05K 1/11* (2006.01)
*H05K 1/02* (2006.01)
*G06F 3/041* (2006.01)
*H05K 3/00* (2006.01)

(52) U.S. Cl.
USPC ........ 174/266; 174/259; 174/50.53; 174/564; 361/785; 29/837; 345/173

(58) Field of Classification Search
CPC ....... H05K 3/305; H05K 3/321; H05K 3/323; H05K 3/386; H05K 5/061; H05K 9/0015; H01L 2224/16012; H01L 23/10; G06F 1/1613; G06F 1/1626; G06F 1/1643; G06F 1/1692; G06F 3/041; G06F 3/044; G06F 2200/1639; G02F 1/13338
USPC ........... 174/250, 255–259, 261, 50.52, 50.53, 174/50.54, 50.61, 266, 365, 368, 359, 564; 361/760, 785, 786, 789; 345/173; 29/829, 832, 837
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |

(Continued)

FOREIGN PATENT DOCUMENTS

WO    WO 2012/129247    9/2012

OTHER PUBLICATIONS

U.S. Appl. No. 61/454,936, filed Mar. 21, 2011, Myers.
U.S. Appl. No. 61/454,950, filed Mar. 21, 2011, Lynch.

(Continued)

*Primary Examiner* — Hoa C Nguyen
(74) *Attorney, Agent, or Firm* — Baker Botts LLP

(57) ABSTRACT

In one embodiment, an apparatus includes a cover panel. An adhesive layer is coupled to the cover panel. A perimeter of the adhesive layer forms at least a portion of a gasket seal extending substantially perpendicular to an inner surface of the cover panel. An inner surface of the gasket seal defines an edge of a channel. The apparatus also includes a substrate coupled to the adhesive layer. The substrate includes an outer surface having disposed thereon a connection pad region and drive or sense electrodes. The drive or sense electrodes are disposed between the substrate and the cover panel. At least a portion of the channel is disposed between the gasket seal and the connection pad region. The apparatus further includes a flexible printed circuit (FPC) electrically coupled by the connection pad region to the drive or sense electrodes. A first portion of the FPC extends through the channel.

20 Claims, 10 Drawing Sheets

(56) References Cited

U.S. PATENT DOCUMENTS

| | | |
|---|---|---|
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 2009/0160819 A1* | 6/2009 | Sasaki et al. ............... 345/174 |
| 2009/0315854 A1 | 12/2009 | Matsuo |
| 2010/0156811 A1* | 6/2010 | Long et al. ................. 345/173 |
| 2011/0181545 A1* | 7/2011 | Takahashi et al. ........... 345/174 |
| 2011/0227867 A1* | 9/2011 | Ogawa et al. .............. 345/174 |
| 2012/0075817 A1* | 3/2012 | Yeates et al. ............... 361/760 |
| 2012/0098782 A1* | 4/2012 | Nam ........................ 345/174 |
| 2012/0105350 A1* | 5/2012 | Lee et al. ................... 345/173 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |
| 2013/0106726 A1* | 5/2013 | Ho ............................ 345/173 |
| 2013/0271384 A1* | 10/2013 | Chuang et al. ............. 345/173 |

OTHER PUBLICATIONS

U.S. Appl. No. 61/454,894, filed Mar. 21, 2011, Rothkopf.

* cited by examiner

US 8,803,004 B2

COMPLEX ADHESIVE BOUNDARIES FOR TOUCH SENSORS

RELATED APPLICATION

This application is a continuation-in-part of U.S. application Ser. No. 13/536,172 filed Jun. 28, 2012.

TECHNICAL FIELD

This invention relates generally to a touch sensor, and more particularly to complex adhesive boundaries for touch sensors.

BACKGROUND OF THE INVENTION

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

SUMMARY OF THE INVENTION

In one embodiment, an apparatus includes a cover panel. An adhesive layer is coupled to the cover panel. A perimeter of the adhesive layer forms at least a portion of a gasket seal extending substantially perpendicular to an inner surface of the cover panel. An inner surface of the gasket seal defines an edge of a channel. The apparatus also includes a substrate coupled to the adhesive layer. The substrate includes an outer surface having disposed thereon a connection pad region and drive or sense electrodes. The drive or sense electrodes are disposed between the substrate and the cover panel. At least a portion of the channel is disposed between the gasket seal and the connection pad region. The apparatus further includes a flexible printed circuit (FPC) electrically coupled by the connection pad region to the drive or sense electrodes. A first portion of the FPC extends through the channel in a direction substantially perpendicular to the inner surface of the cover panel and substantially parallel to the inner surface of the gasket seal.

In another embodiment, an apparatus includes a cover panel, first and second adhesive layers, a substrate, and dielectric layer, and a flexible printed circuit (FPC). The first optically clear adhesive layer is coupled to the cover panel. The substrate is coupled to the first adhesive layer and comprises outer and inner surfaces, the outer and inner surfaces of the substrate being on opposite sides of the substrate with respect to each other. The outer surface of the substrate has disposed thereon a first connection pad region and first drive or sense electrodes, the drive or sense electrodes disposed between the substrate and the cover panel. The inner surface of the substrate has disposed thereon a second connection pad region and second drive or sense electrodes. The second adhesive layer is coupled to the inner surface of the substrate. The dielectric layer is coupled to the second adhesive layer. The FPC is electrically coupled by the first connection pad region to the first drive or sense electrodes. Respective portions of the first adhesive layer, the substrate, the second adhesive layer, and the dielectric layer collectively form a gasket seal around a perimeter of the cover panel. The gasket seal extends in a direction away from the cover panel along an axis substantially perpendicular to the outer and inner surfaces of the substrate. An inner surface of the gasket seal defines an edge of a channel. A portion of the FPC is disposed within the channel and extends through respective openings in each of the first adhesive layer, the substrate, the second adhesive layer, and the dielectric layer.

In a method embodiment, a method includes forming a connection pad region and drive or sense electrodes on an outer surface of a substrate. A connection pad region and drive or sense electrodes are formed on an inner surface of the substrate. A first adhesive layer adheres to the outer surface of the substrate. A second adhesive layer adheres to the inner surface of the substrate. The method further includes forming a channel extending in a direction substantially perpendicular to the inner and outer surfaces of the substrate, at least in part, by cutting away selective portions of the substrate and the first and second adhesive layers. A portion of a flexible printed circuit (FPC) is inserted into the channel formed. The FPC is bent, such that a first portion of the FPC is disposed outwardly from the connection pad region formed on the outer surface of the substrate while a second portion of the FPC is disposed within the channel. The method further includes electrically coupling the FPC to the drive or sense electrodes formed on the outer surface of the substrate, at least in part, by bonding the FPC to the connection pad region formed on the outer surface of the substrate.

DETAILED DESCRIPTION OF THE DRAWINGS

Figure 1:
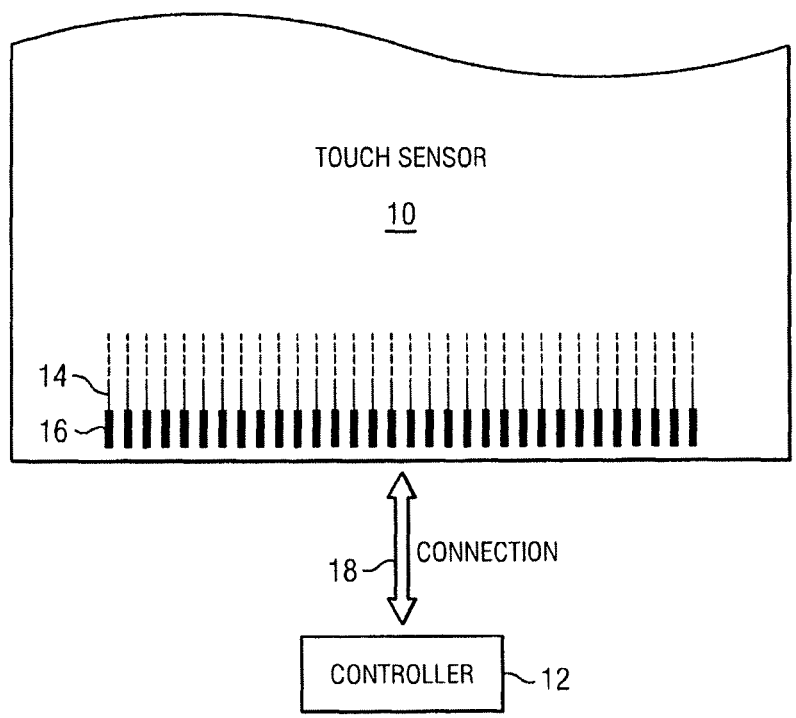
FIG. 1 illustrates an example touch sensor with an example controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack includes a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA is disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF) or anisotropic conductive paste (ACP). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
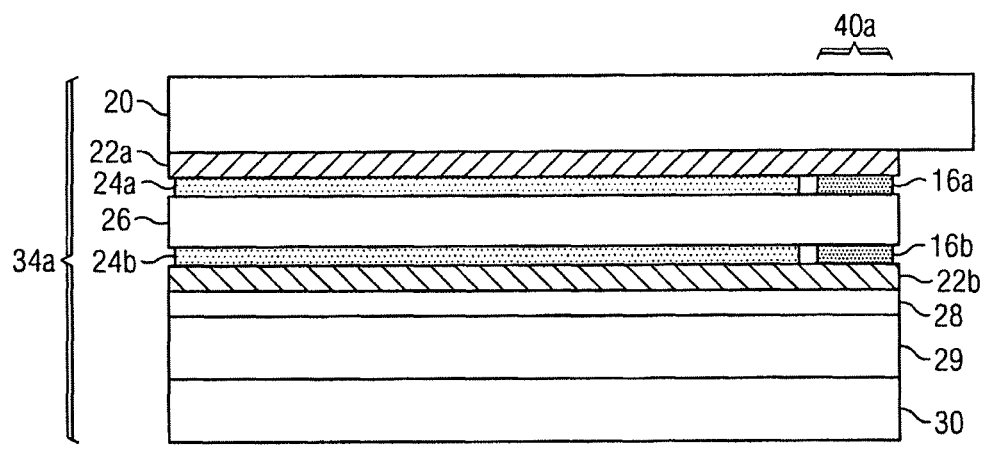
FIG. 2A-2C illustrate different views of an example mechanical stack.
Figure 2B:
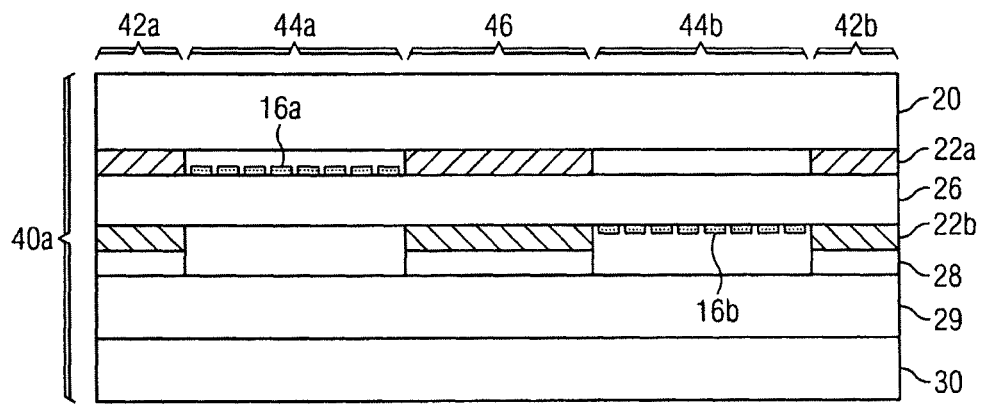
Figure 2C:
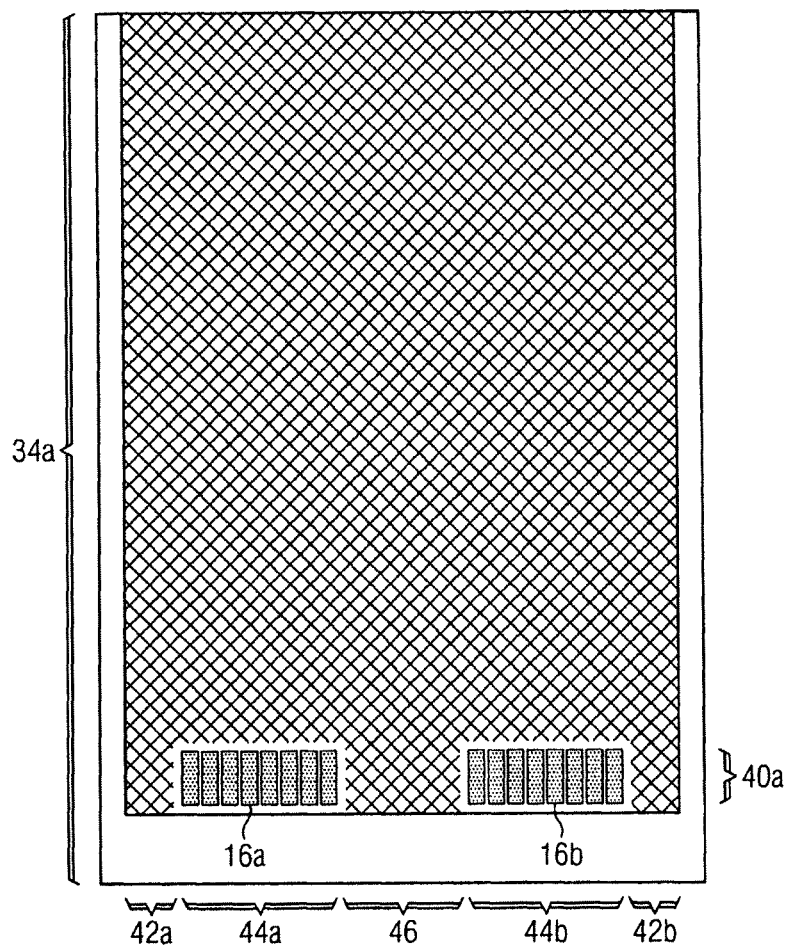

FIGS. 2A-2C illustrate different views of an example mechanical stack 34a. FIG. 2A shows a longitudinal view of mechanical stack 34a. Mechanical stack 34a includes a substrate 26 with conductive material 24a-b forming the drive and sense electrodes of the touch sensor 10, disposed on opposing surfaces of substrate 26. One or more portions of substrate 26 may be made of PET, glass, PMMA, or another suitable material, and this disclosure contemplates any suitable substrate made of any suitable material. In particular embodiments, mechanical stack 34a includes a first adhesive layer 22a disposed between cover panel 20 and substrate 26. Mechanical stack 34a also includes a second adhesive layer 22b and a dielectric layer 28. The second adhesive layer 22b is disposed between substrate 26 and dielectric layer 28, and dielectric layer 28 is disposed between adhesive layer 22b and an air gap 29 to a display 30 of a device including touch sensor 10. Dielectric layer 28 may be made of PET or another suitable material. As an example and not by way of limitation, adhesive layers 22a-b are made from OCA. As described above, cover panel 20 is made of substantially transparent material, such as for example, glass, PC, or PMMA, and this disclosure contemplates any suitable cover panel made of any suitable material.

As an example and not by way of limitation, cover panel 20 has a thickness of approximately 1 mm; first adhesive layer 22a has a thickness of approximately 0.1 mm; substrate 26 with conductive material 24a-b forming the drive and sense electrodes has a thickness of approximately 0.05 mm (including the conductive material forming the drive and sense electrodes); second adhesive layer 22b has a thickness of approximately 0.025 mm; and dielectric layer 28 has a thickness of approximately 0.05 mm.

Conductive material 24a-b forming the drive and sense electrodes may be an area of conductive material that forms a shape, such as for example, a disk, square, rectangle, other suitable shape or suitable combination of these disposed on a surface of substrate 26. As an example and not by way of limitation, conductive material 24a-b of an electrode is made from a conductive mesh of fine lines of conductive material (such as for example, carbon nanotubes, gold, aluminum, copper, silver, or copper- or silver-based material) or other conductive material, and the fine lines of conductive material occupies approximately 10% of the area of its shape in a hatched or other suitable pattern. As another example, the conductive mesh substantially covers an entire active area of the touch sensor 10. In particular embodiments, conductive material 24a-b is opaque. Although the fine lines of conductive material 24a-b are opaque, the combined optical transmissivity of electrodes formed using a conductive mesh is approximately 95% or higher, ignoring a reduction in transmittance due to other factors such as the substantially flexible substrate material 26. In other particular embodiments, the electrodes, tracking, and connection pads of the touch sensor are formed from conductive material 24a-b.

In certain embodiments, substrate 26 has connection pads 16a-b disposed on opposing sides of substrate 26, as shown in FIG. 2A. Connection pads 16a-b define a three-dimensional connection pad region 40a within mechanical stack 34a. FIG. 2C illustrates a top view of mechanical stack 34a. In FIG. 2C, the hatched area represents adhesive layers 22a-b, corresponding to a superposition of the shading patterns used for adhesive layers 22a-b in FIGS. 2A-2B. As shown in FIG. 2C, connection pad region 40a extends across the entire width of mechanical stack 34a. Connection pad region 40a also extends through all layers of mechanical stack 34a, as shown in FIG. 2A. In certain embodiments, substrate 26 may have only a single connection pad 16 disposed on a surface of substrate 26, or may have three or more connection pads 16 disposed on a surface of substrate 26. This disclosure contemplates any suitable number of connection pads 16.

As described above, touch-sensor controller 12 may be disposed on an FPC, and the FPC may be bonded to connection pads 16a-b using ACF or ACP. Because substrate 26 has a thickness of 0.05 mm, the weight of the FPC or forces during bonding could place stress on substrate 26 at connection pad region 40a, which could bend substrate 26, possibly causing damage to or breaks in conductive material 24a-b. In particular embodiments, adhesive layers 22a-b may extend longitudinally into portions of connection pad region 40a in order to provide support around connection pads 16a-b. In certain embodiments, dielectric layer 28 co-extends with second adhesive layer 22b, as illustrated in the example of FIGS. 2A-2C. In addition to providing support, extending adhesive layers 22a-b into portions of connection pad region 40a may form a sealing gasket to cover panel 20 for improved resistance to moisture ingress, which could corrode conductive material 24a-b.

In FIGS. 2A-2C, for example, first adhesive layer 22a and second adhesive layer 22b both have three extensions into connection pad region 40a, which appear to overlap when viewed from the perspective of FIG. 2C: one between connection pad 16a and connection pad 16b, one between connection pad 16a and a first outer edge of mechanical stack 34a, and one between connection pad 16b and the opposite outer edge of mechanical stack 34a. In certain other embodiments, adhesive layers 22a-b may extend together into more or fewer portions of connection pad region 40a. In further embodiments, adhesive layers 22a-b may extend together into certain portions of connection pad region 40a, but extend separately into certain other portions of connection pad region 40a. Alternatively, adhesive layers 22a-b may extend into entirely separate portions of connection pad region 40a, only first adhesive layer 22a may extend into portions of connection pad region 40a, or only second adhesive layer 22b may extend into portions of connection pad region 40a.

FIG. 2B illustrates a transverse cross-sectional view of mechanical stack 34a at connection pad region 40a. Connection pad region 40a may be divided into several three-dimensional zones 42-46. Each connection pad 16 within connection pad region 40a defines a connection pad zone 44, which extends through all layers of mechanical stack 34a. As illustrated in FIG. 2B for example, connection pad 16a defines connection pad zone 44a, which occupies roughly the area of connection pad 16a and extends through all layers of mechanical stack 34a. Likewise, connection pad 16b defines connection pad zone 44b, which occupies roughly the area of connection pad 16b and extends through all layers of mechanical stack 34a. The area between two connection pad zones 44 within a connection pad region 40a defines a central zone 46, which extends through all layers of mechanical stack 34a. In the example of FIGS. 2B-2C, central zone 46 is located between connection pad zone 44a and connection pad zone 44b. The area between the outer edge of connection pad region 40a and a connection pad zone 44 defines an outer zone 42, which extends through all layers of mechanical stack 34a. For example, outer zone 42a is located between connection pad zone 44a and one outer edge of connection pad region 40a, and outer zone 42b is located between connection pad zone 44b and the opposite outer edge of the connection pad region 40a.

In particular embodiments, adhesive layers 22a-b may extend longitudinally to one or more zones 42-46 within connection pad region 40a in order to provide support around connection pads 16a-b. As illustrated in FIGS. 2B-2C for example, first adhesive layer 22a extends to outer zone 42a, central zone 46, and outer zone 42b; and second adhesive layer 22b also extends to outer zone 42a, central zone 46, and outer zone 42b. In certain other embodiments, first adhesive layer 22a may extend to outer zone 42a only, outer zone 42b only, central zone 46 only, outer zone 42a and central zone 46, outer zone 42b and central zone 46, or any suitable combination of the foregoing. Likewise, in combination with any of the foregoing configurations of first adhesive layer 22a, second adhesive layer 22b may extend to outer zone 42a only, outer zone 42b only, central zone 46 only, outer zone 42a and central zone 46, outer zone 42b and central zone 46, or any suitable combination of the foregoing. In further embodiments, only one of adhesive layers 22a-b may extend into one or more zones 42-46 within connection pad region 40a.

Figure 3A:
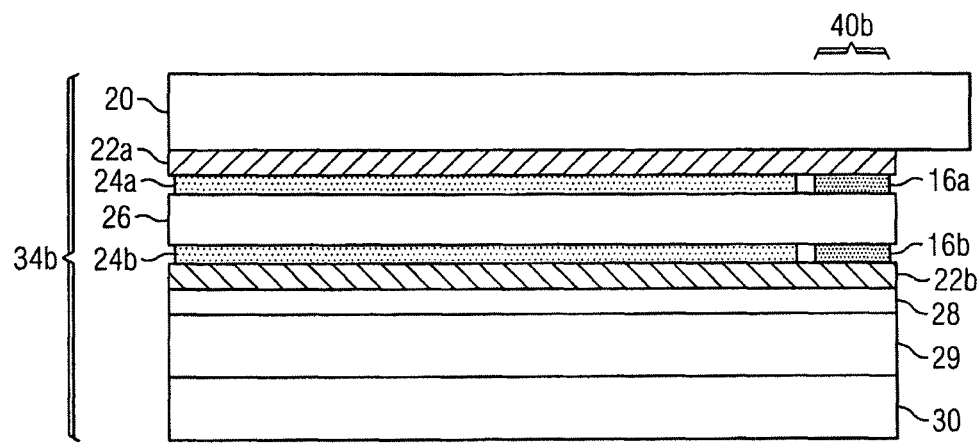
FIG. 3A-3C illustrate different views of another example mechanical stack.
Figure 3B:
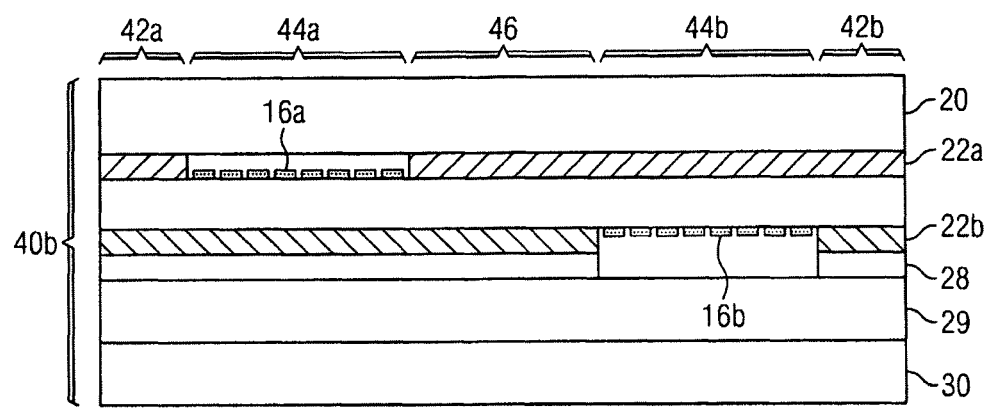
Figure 3C:
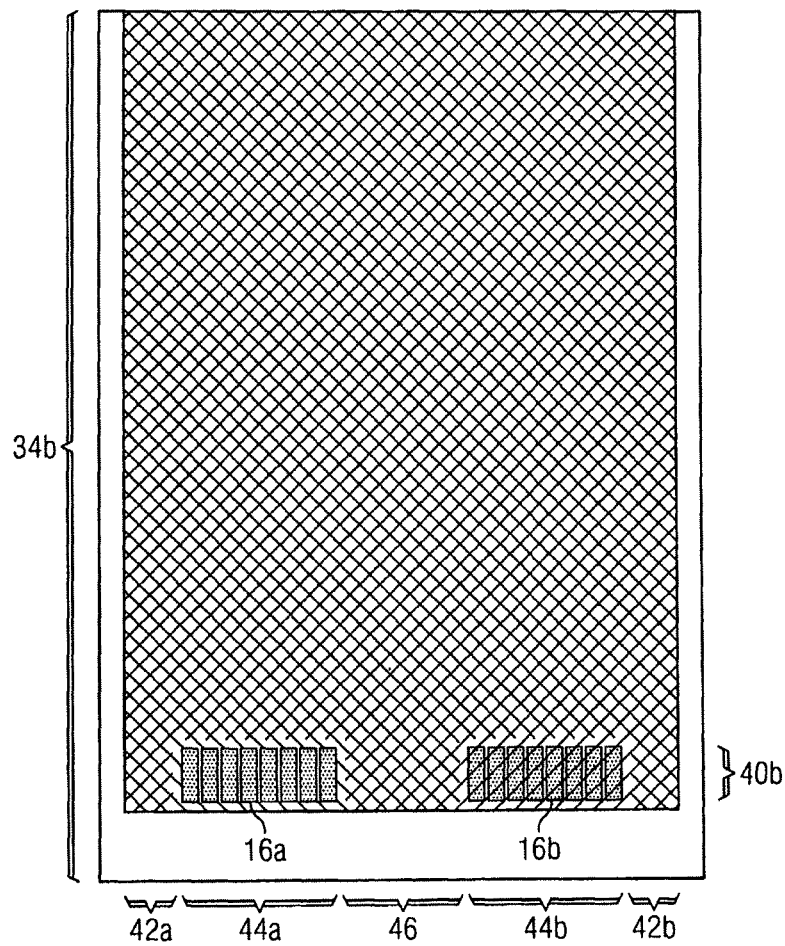

FIGS. 3A-3C illustrate different views of another example mechanical stack 34b. FIG. 3A illustrates a longitudinal view of mechanical stack 34b. FIG. 3B illustrates a transverse cross-sectional view of mechanical stack 34b at connection pad region 40b. FIG. 3C illustrates a top view of mechanical stack 34b. Mechanical stack 34b includes a substrate 26 with conductive material 24a-b forming the drive and sense electrodes of the touch sensor 10, disposed on opposing surfaces of substrate 26. In certain embodiments, mechanical stack 34b includes a first adhesive layer 22a, a second adhesive layer 22b, and a dielectric layer 28, as illustrated in FIG. 3A. First adhesive layer 22a is disposed between cover panel 20 and substrate 26; second adhesive layer 22b is disposed between substrate 26 and dielectric layer 28, and dielectric layer 28 is disposed between adhesive layer 22b and an air gap 29 to a display 30 of a device including touch sensor 10.

In certain embodiments, substrate 26 has connection pads 16a-b disposed on opposing sides of substrate 26, as shown in FIG. 3A. Connection pads 16a-b define a three-dimensional connection pad region 40b within mechanical stack 34b. As described above, connection pad region 40b extends across the entire width of mechanical stack 34b, as shown in FIG. 3C, and extends through all layers of mechanical stack 34b, as shown in FIG. 3A. Connection pad region 40b may be divided into several three-dimensional zones 42-46, which extend through all layers of mechanical stack 34b as illustrated in FIGS. 3B-3C: outer zone 42a, connection pad zone 44a (defined by connection pad 16a), central zone 46, connection pad zone 44b (defined by connection pad 16b), and outer zone 42b. In certain embodiments, substrate 26 may have only a single connection pad 16 disposed on a surface of substrate 26, or may have three or more connection pads 16 disposed on a surface of substrate 26. This disclosure contemplates any suitable number of connection pads 16.

In the example of FIGS. 3A-3C, adhesive layers 22a-b extend longitudinally into several zones 42-46 within connection pad region 40b in order to provide support around connection pads 16a-b. Specifically, first adhesive layer 22a extends to outer zone 42a, central zone 46, connection pad zone 44b, and outer zone 42b; and second adhesive layer 22b extends to outer zone 42a, connection pad zone 44a, central zone 46, and outer zone 42b. In certain embodiments, dielectric layer 28 co-extends with second adhesive layer 22b, as illustrated in the example of FIGS. 3A-3C. In this configuration, adhesive is present opposite both connection pads 16a-b across substrate 26 (e.g. first adhesive layer 22a in connection pad zone 44b and second adhesive layer 22b in connection pad zone 44a). In FIG. 3C, the hatched area represents adhesive layers 22a-b, corresponding to a superposition of the shading patterns used for adhesive layers 22a-b in FIGS. 3A-3B. In areas where one adhesive layer 22 is present, but the other is not (i.e. connection pad zones 44a-b), only the shading pattern for the adhesive layer 22 which is present is depicted.

Using conventional ACF or ACP to bond an FPC to connection pads 16a-b may damage or degrade the adhesive opposite connection pads 16a-b. As a result, the FPC including touch-sensor controller 12 may be bonded to connection pads 16a-b using low-temperature ACF or low-temperature ACP. Low-temperature ACF and ACP generally bond at temperatures below approximately 160° C. The configuration of adhesive layers 22a-b depicted in FIGS. 3A-3C provides support throughout connection pad region 40b, including the areas directly opposite connection pads 16a-b. Moreover, in the configuration depicted in FIGS. 3A-3C, the first adhesive layer 22a forms a partial sealing gasket at the interface between first adhesive layer 22a and cover panel 20 to resist moisture ingress.

Figure 4A:
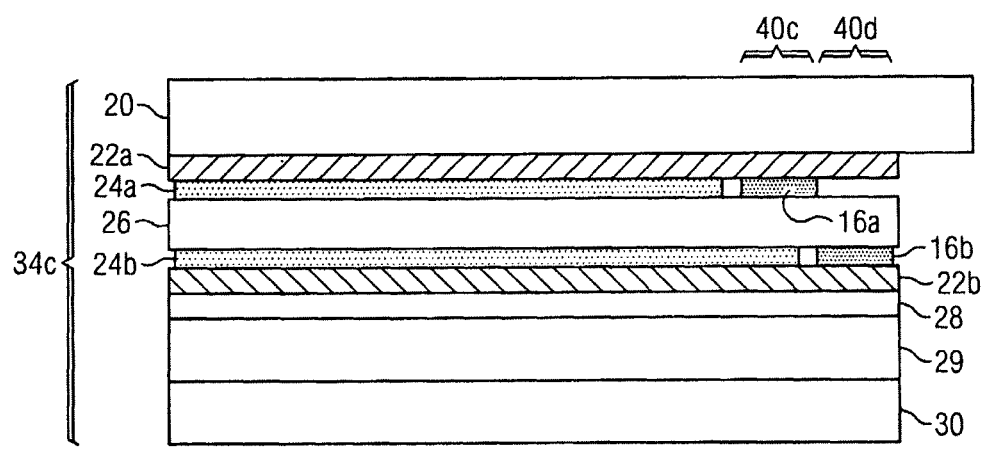
FIG. 4A-4D illustrate different views of an example mechanical stack with multiple connection pad regions.
Figure 4B:
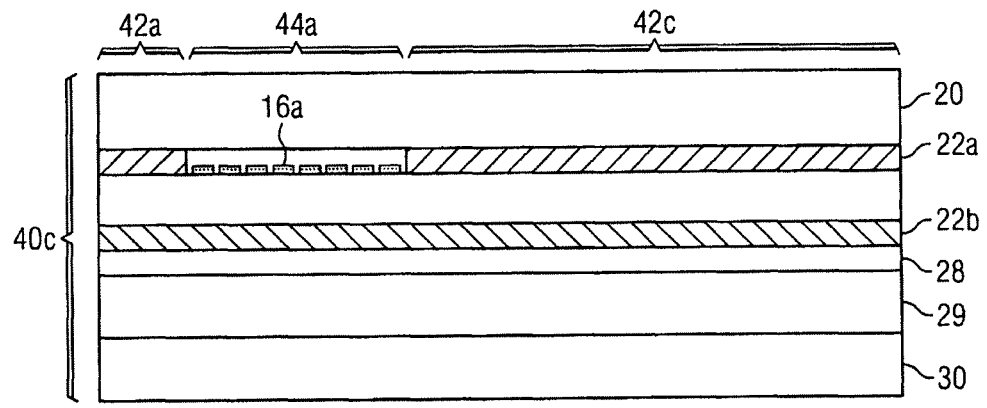
Figure 4C:
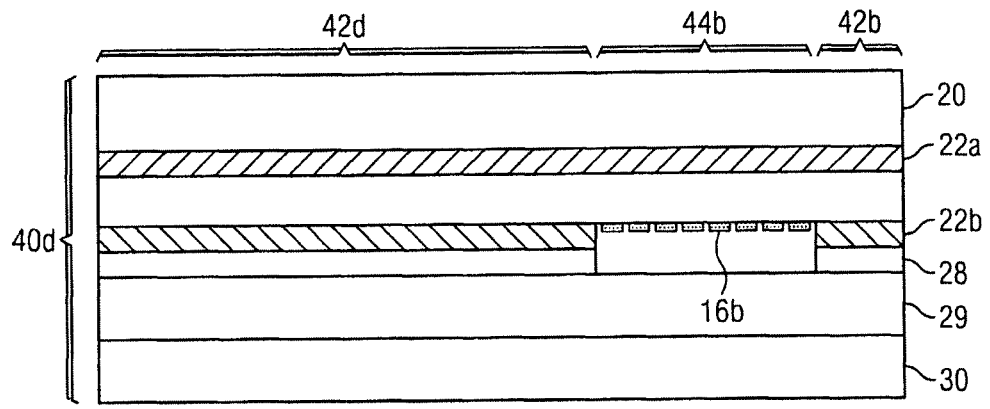
Figure 4D:
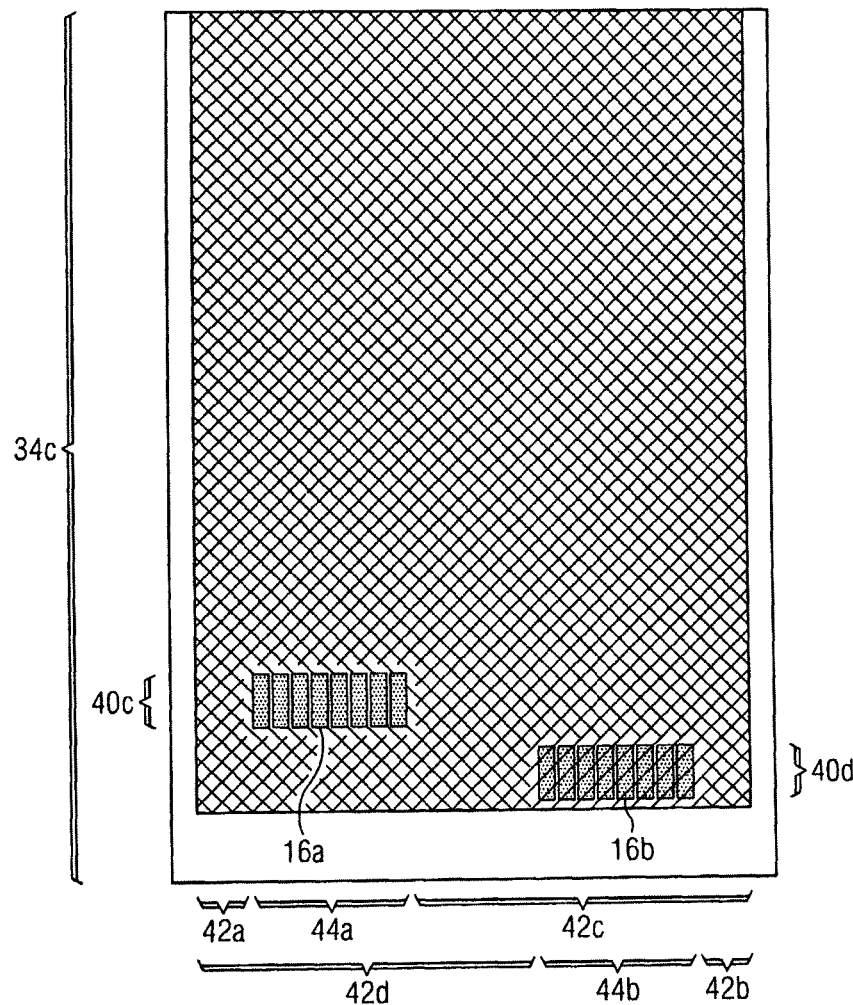

In the example mechanical stacks of FIGS. 2A-2C and FIGS. 3A-3C, connection pads 16a-b are aligned and together define a single connection pad region 40. In certain other embodiments, connection pads 16a-b may be offset, each defining a separate connection pad region 40. FIGS. 4A-4D illustrate different views of an example mechanical stack 34c with multiple connection pad regions 40c-d. FIG. 4A illustrates a longitudinal view of mechanical stack 34c. FIG. 4B illustrates a transverse cross-sectional view of mechanical stack 34c at connection pad region 40c. FIG. 4C illustrates a transverse cross-sectional view of mechanical stack 34c at connection pad region 40d. FIG. 4D illustrates a top view of mechanical stack 34c. Mechanical stack 34c includes a substrate 26 with conductive material 24a-b forming the drive and sense electrodes of the touch sensor 10, disposed on opposing surfaces of substrate 26. In certain embodiments, mechanical stack 34c includes a first adhesive layer 22a, a second adhesive layer 22b, and a dielectric layer 28, as illustrated in FIG. 4A. First adhesive layer 22a is disposed between cover panel 20 and substrate 26; second adhesive layer 22b is disposed between substrate 26 and dielectric layer 28, and dielectric layer 28 is disposed between adhesive layer 22b and an air gap 29 to a display 30 of a device including touch sensor 10.

In certain embodiments, substrate 26 has connection pads 16a-b disposed on opposing sides of substrate 26, as shown in FIG. 4A. Connection pads 16a-b are offset from one another, as shown in FIGS. 4A and 4D. Connection pad 16a defines a three-dimensional connection pad region 40c within mechanical stack 34c. Connection pad 16b defines a three-dimensional connection pad region 40d within mechanical stack 34c. As described above, connection pad regions 40c-d extend across the entire width of mechanical stack 34c, as shown in FIG. 4D, and extend through all layers of mechanical stack 34c, as shown in FIG. 4A. Although in the example of FIGS. 4A-4D, the offset between connection pads 16a-b is sufficiently large that connection pad regions 40c-d are non-overlapping, this disclosure contemplates any suitable offset between connection pads 16a-b, including small offsets which would result in overlap between connection pad regions 40c-d. Connection pad regions 40c-d may be divided into several three-dimensional zones 42-44, which extend through all layers of mechanical stack 34c as illustrated in FIGS. 4B-4D. Connection pad region 40c is divided into outer zone 42a, connection pad zone 44a (defined by connection pad 16a), and outer zone 42c. Connection pad region 40d is divided into outer zone 42d, connection pad zone 44b (defined by connection pad 16b), and outer zone 42b. In certain embodiments, substrate 26 may have only a single connection pad 16 disposed on a surface of substrate 26, or may have three or more connection pads 16 disposed on a surface of substrate 26. This disclosure contemplates any suitable number of connection pads 16.

In the example of FIGS. 4A-4D, adhesive layers 22a-b extend longitudinally into zones 42a-d within connection pad regions 40c-d in order to provide support around connection pads 16a-b. Specifically, first adhesive layer 22a extends to outer zone 42a and outer zone 42c of connection pad region 40c, and to outer zone 42d, connection pad zone 44b, and outer zone 42b of connection pad region 40d; and second adhesive layer 22b extends to outer zone 42a, connection pad zone 44a, and outer zone 42c of connection pad region 40c, and to outer zone 42d and outer zone 42b of connection pad region 40d. In certain embodiments, dielectric layer 28 co-extends with second adhesive layer 22b, as illustrated in the example of FIGS. 4A-4D. In FIG. 4D, the hatched area represents adhesive layers 22a-b, corresponding to a superposition of the shading patterns used for adhesive layers 22a-b in FIGS. 4A-4C. In areas where one adhesive layer 22 is present, but the other is not (i.e. connection pad zones 44a-b), only the shading pattern for the adhesive layer 22 which is present is depicted.

In further embodiments, first adhesive layer 22a may not extend to connection pad zone 44b within connection pad region 40d and/or second adhesive layer 22b may not extend to connection pad zone 44a within connection pad region 40c. Alternatively, first adhesive layer 22a may extend to outer zone 42a only, outer zone 42c only, outer zone 42d only, connection pad zone 44b only, outer zone 42b only, or any suitable combination of the foregoing. Likewise, in combination with any of the foregoing configurations of first adhesive layer 22a, second adhesive layer 22b may extend to outer zone 42a only, connection pad zone 444a only, outer zone 42c only, outer zone 42d only, outer zone 42b only, or any suitable combination of the foregoing. In certain other embodiments, only one of adhesive layers 22a-b may extend into one or more zones 42-44 within connection pad regions 40c-d.

Figure 5A:
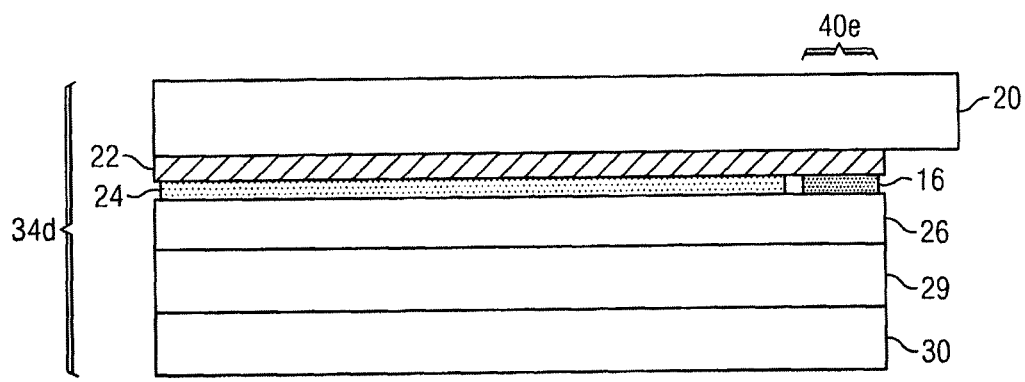
FIG. 5A-5C illustrate different views of another example mechanical stack.
Figure 5B:
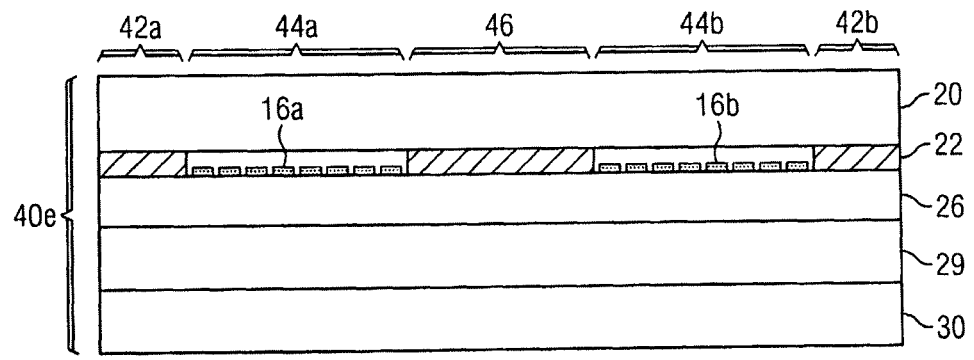
Figure 5C:
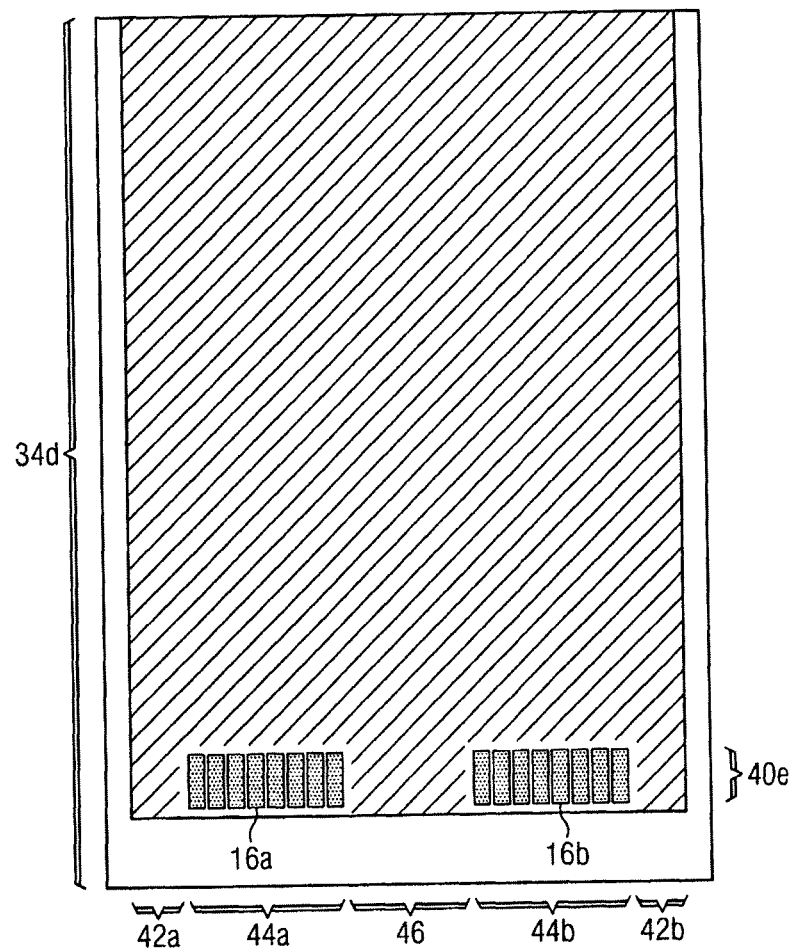

FIGS. 5A-5C illustrate different views of another example mechanical stack 34d. FIG. 5A illustrates a longitudinal view of mechanical stack 34d. FIG. 5B illustrates a transverse cross-sectional view of mechanical stack 34d at connection pad region 40e. FIG. 5C illustrates a top view of mechanical stack 34d. Mechanical stack 34d includes a substrate 26 with conductive material 24 forming the drive and sense electrodes of the touch sensor 10, disposed on a surface of substrate 26. In certain embodiments, mechanical stack 34d includes an adhesive layer 22 disposed between cover panel 20 and substrate 26, with conductive material 24 disposed on the surface of substrate 26 nearest adhesive layer 22, as illustrated in FIG. 5A. Substrate 26 is disposed between adhesive layer 22 and an air gap 29 to a display 30 of a device including touch sensor 10 and touch sensor controller 12.

In certain embodiments, substrate 26 has connection pads 16a-b disposed on a surface of substrate 26, such as the surface nearest adhesive layer 22, as shown in FIG. 5A. Connection pads 16a-b define a three-dimensional connection pad region 40e within mechanical stack 34d. As described above, connection pad region 40e extends across the entire width of mechanical stack 34d, as shown in FIG. 5C, and extends through all layers of mechanical stack 34d, as shown in FIG. 5A. Connection pad region 40e may be divided into several three-dimensional zones 42-46, which extend through all layers of mechanical stack 34d as illustrated in FIGS. 5B-5C: outer zone 42a, connection pad zone 44a (defined by connection pad 16a), central zone 46, connection pad zone 44b (defined by connection pad 16b), and outer zone 42b. In certain other embodiments, substrate 26 may have only a single connection pad 16 disposed on a surface, or may have three or more connection pads 16 disposed on a surface. This disclosure contemplates any suitable number of connection pads 16.

In the example of FIGS. 5A-5C, adhesive layer 22 extends longitudinally into several zones 42-46 within connection pad region 40e in order to provide support around connection pads 16a-b. Specifically, adhesive layer 22 extends to outer zone 42a, central zone 46, and outer zone 42b. In certain other embodiments, adhesive layer 22 may extend to outer zone 42a only, central zone 46 only, outer zone 42b only, or any suitable combination of the foregoing. In FIG. 5C, the shaded area represents adhesive layer 22, corresponding to the shading pattern used for adhesive layer 22 in FIGS. 5A-5B.

Figure 6A:
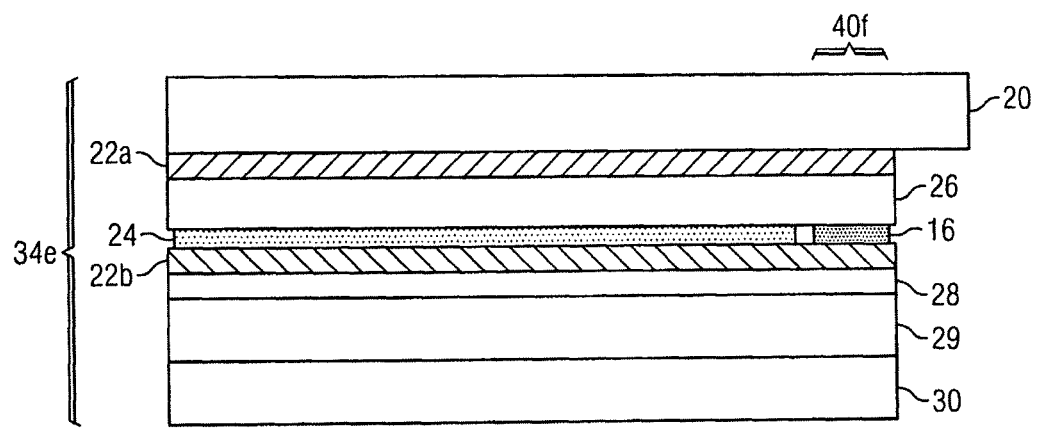
FIG. 6A-6C illustrate different views of another example mechanical stack.
Figure 6B:
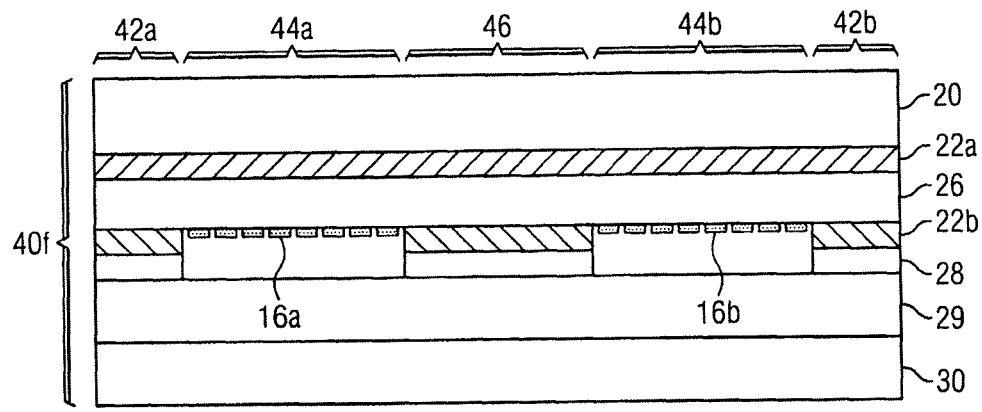
Figure 6C:
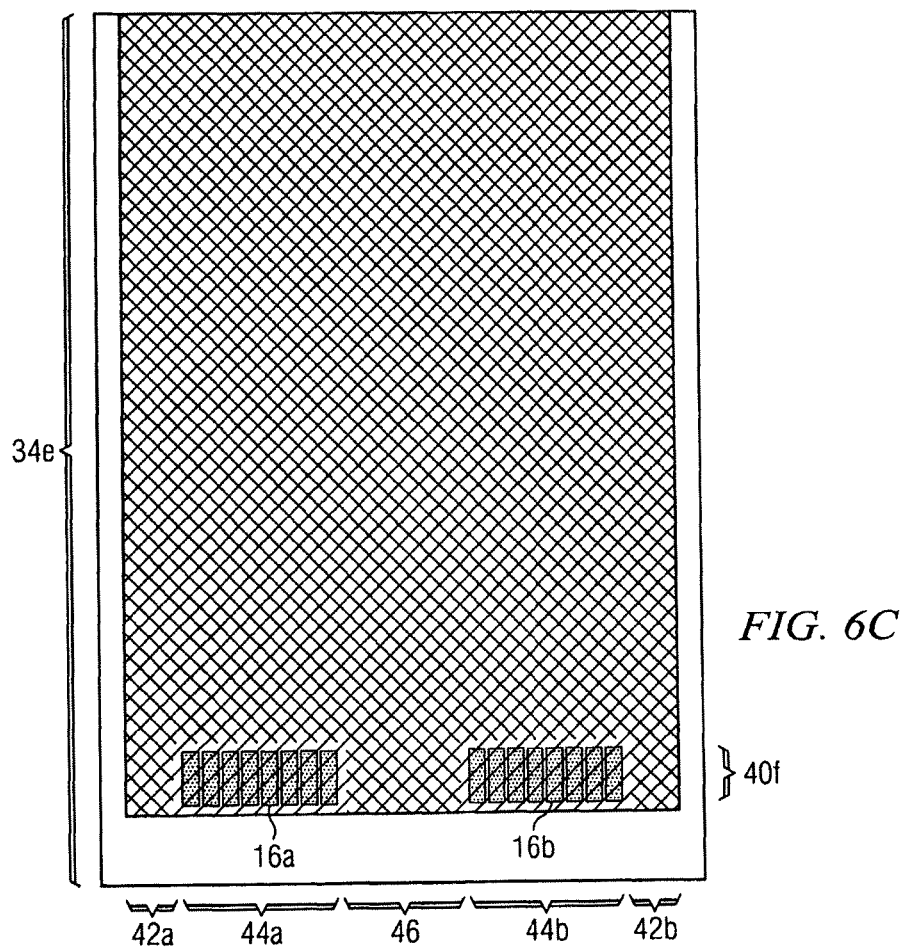

FIGS. 6A-6C illustrate different views of another example mechanical stack 34e. FIG. 6A illustrates a longitudinal view of mechanical stack 34e. FIG. 6B illustrates a transverse cross-sectional view of mechanical stack 34e at connection pad region 40f. FIG. 6C illustrates a top view of mechanical stack 34e. Mechanical stack 34e includes a substrate 26 with conductive material 24a-b forming the drive and sense electrodes of the touch sensor 10, disposed on a surface of substrate 26. In certain embodiments, mechanical stack 34e includes a first adhesive layer 22a, a second adhesive layer 22b, and a dielectric layer 28, as illustrated in FIG. 6A. First adhesive layer 22a is disposed between cover panel 20 and substrate 26; second adhesive layer 22b is disposed between substrate 26 and dielectric layer 28, dielectric layer 28 is disposed between adhesive layer 22b and an air gap 29 to a display 30 of a device including touch sensor 10 and touch sensor controller 12, and conductive material 24 is disposed on the surface of substrate 26 nearest second adhesive layer 22b.

In certain embodiments, substrate 26 has connection pads 16a-b disposed on a surface of substrate 26, such as the surface nearest second adhesive layer 22b, as shown in FIG. 6A. Connection pads 16a-b define a three-dimensional connection pad region 40f within mechanical stack 34e. As described above, connection pad region 40f extends across the entire width of mechanical stack 34e, as shown in FIG. 6C, and extends through all layers of mechanical stack 34e, as shown in FIG. 6A. Connection pad region 40f may be divided into several three-dimensional zones 42-46, which extend through all layers of mechanical stack 34e as illustrated in FIGS. 6B-6C: outer zone 42a, connection pad zone 44a (defined by connection pad 16a), central zone 46, connection pad zone 44b (defined by connection pad 16b), and outer zone 42b. In certain other embodiments, substrate 26 may have only a single connection pad 16 disposed on a surface, or may have three or more connection pads 16 disposed on a surface. This disclosure contemplates any suitable number of connection pads 16.

In the example of FIGS. 6A-6C, adhesive layers 22a-b extend longitudinally into several zones 42-46 within connection pad region 40f in order to provide support around connection pads 16a-b. Specifically, first adhesive layer 22a extends to outer zone 42a, connection pad zone 44a, central zone 46, connection pad zone 44b, and outer zone 42b; and second adhesive layer 22b extends to outer zone 42a, central zone 46, and outer zone 42b. In certain embodiments, dielectric layer 28 co-extends with second adhesive layer 22b, as illustrated in the example of FIGS. 6A-6C. In this configuration, adhesive is present opposite both connection pads 16a-b across substrate 26. As a result, the FPC including touch-sensor controller 12 may be bonded to connection pads 16a-b using low-temperature ACF or low-temperature ACP, which generally bonds at temperatures below approximately 160° C. In FIG. 6C, the hatched area represents adhesive layers 22a-b, corresponding to a superposition of the shading patterns used for adhesive layers 22a-b in FIGS. 6A-6B. In areas where adhesive layer 22a is present, but adhesive layer 22b is not (i.e. connection pad zones 44a-b), only the shading pattern for adhesive layer 22a is depicted.

Figure 7:
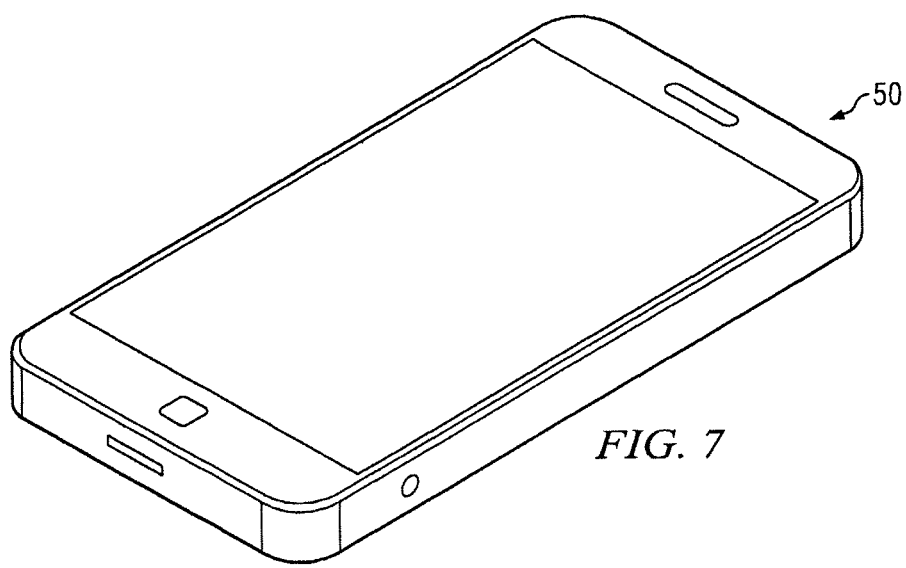
FIG. 7 illustrates an example device incorporating a touch sensor disposed on a mechanical stack.

FIG. 7 illustrates an example device 50 incorporating a touch sensor 10 disposed on a mechanical stack 34. As described above, examples of device 50 include a smartphone, a PDA, a tablet computer, a laptop computer, a desktop computer, a kiosk computer, a satellite navigation device, a portable media player, a portable game console, a point-of-sale device, another suitable device, a suitable combination of two or more of these, or a suitable portion of one or more of these. In the example of FIG. 7, device 50 includes a touch sensor 10 implemented using a mechanical stack 34 and a display 30 underneath the touch sensor. The one or more substrates of the mechanical stack 34 include or have attached to them tracking areas, which includes tracks 14 providing drive and sense connections to and from the drive and sense electrodes of the touch sensor. As described above, an electrode pattern of a touch sensor may be made from a conductive mesh using carbon nanotubes, gold, aluminum, copper, silver, or other suitable conductive material. A user of device 50 may interact with device 50 through the touch sensor 10 implemented on a mechanical stack 34 described above. As an example and not by way of limitation, the user interacts with device 50 by touching the touch-sensitive area of the touch sensor.

Figure 8A:
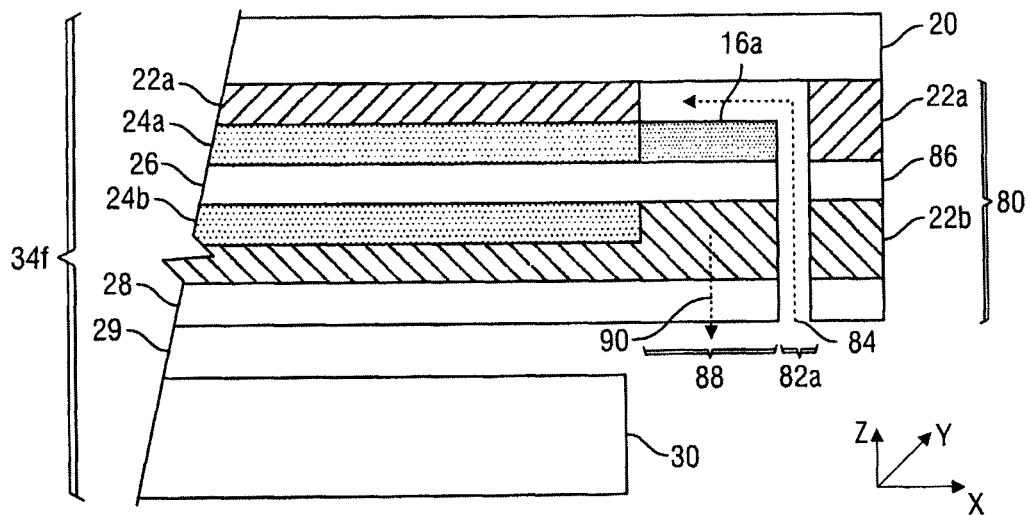
FIGS. 8A and 8B illustrate cross-sectional views of an example mechanical stack forming a gasket seal and having one or more channels extending through at least portions of multiple layers of the mechanical stack.
Figure 8B:
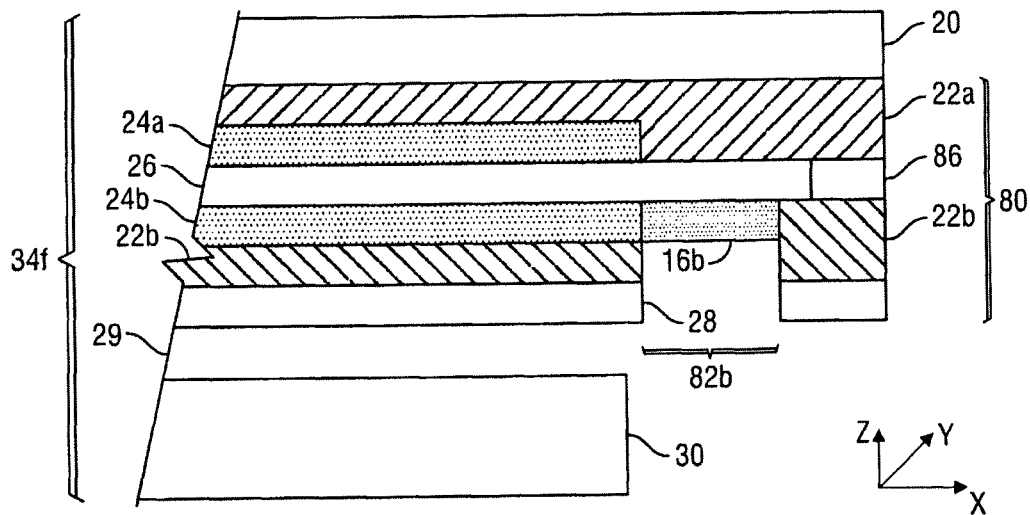

FIGS. 8A and 8B illustrate cross-sectional views of an example mechanical stack 34f. In this example, mechanical stack 34f includes a sealing gasket 80 along an outer edge of at least a portion of mechanical stack 34f. In addition, mechanical stack 34f includes one or more gaps 82 disposed within mechanical stack 34f. As explained further below, sealing gasket 80 may improve resistance to moisture ingress, which could corrode conductive material 24a-b and/or connection pads 16a-b. One or more gaps 82 within mechanical stack 34f may facilitate electrically coupling an FPC and/or other suitable circuitry to connection pads 16 by providing a channel (e.g., channel 84) within mechanical stack 34f through which a portion of an FPC and/or other suitable circuitry may extend. Mechanical stack 34f may be configured to provide mechanical support to substrate 26, which in certain instances may facilitate the electrical coupling of an FPC and/or other suitable circuitry to connection pads 16a-b. For example, the mechanical support may mitigate the risk of damaging portions of mechanical stack 34f (e.g., substrate 26 and/or conductive material 24a-b disposed thereon) when bonding an FPC and/or other suitable circuitry to connection pads 16a-b.

In this example, mechanical stack 34f includes a substrate 26 with conductive material 24a-b forming the drive and sense electrodes of the touch sensor 10, disposed on opposing surfaces of substrate 26. Although this example includes conductive material 24a-b disposed on opposing surfaces of substrate 26, alternative embodiments may include conductive material disposed only on side of substrate 26 (e.g., either 24a or 24b). For example, a single-sided substrate 26 having conductive material 24a may be configured substantially similar to mechanical stack 34f shown in FIG. 8A, with the exception that there may be no conductive material 24b disposed on a surface of substrate 26 opposing conductive material 24a. As another example, a single-sided substrate having conductive material 24b may be configured substantially similar to mechanical stack 34f shown by FIG. 8B, with the exception that there may be no conductive material 24a disposed on a surface of substrate 26 opposing conductive material 24b.

One or more portions of substrate 26 shown in FIGS. 8A and 8B may be made of PET, glass, PMMA, or another suitable material, and this disclosure contemplates any suitable substrate made of any suitable material. In particular embodiments, mechanical stack 34f includes a first adhesive layer 22a disposed between cover panel 20 and substrate 26. Mechanical stack 34f may also include a second adhesive layer 22b disposed between substrate 26 and a dielectric layer 28. Dielectric layer 28 is disposed between adhesive layer 22b and an air gap 29 separating dielectric layer 28 from a display 30 of a device including touch sensor 10. Dielectric layer 28 may be made of PET or another suitable material. As an example and not by way of limitation, adhesive layers 22a-b are made from OCA. As described above, cover panel 20 is made of substantially transparent material, such as for example, glass, PC, or PMMA, and this disclosure contemplates any suitable cover panel made of any suitable material.

As an example and not by way of limitation, cover panel 20 shown in FIGS. 8A and 8B has a thickness of approximately 1 mm; first adhesive layer 22a has a thickness of approximately 0.1 mm; substrate 26 with conductive material 24a-b forming the drive and sense electrodes has a thickness of approximately 0.05 mm (including the conductive material forming the drive and sense electrodes); second adhesive layer 22b has a thickness of approximately 0.025 mm; and dielectric layer 28 has a thickness of approximately 0.05 mm.

Conductive material 24a-b shown in FIGS. 8A and 8B may form drive and sense electrodes. Conductive material 24a-b may be an area of conductive material that forms a shape, such as for example, a disk, square, rectangle, other suitable shape or suitable combination of these disposed on a surface of substrate 26. As an example and not by way of limitation, conductive material 24a-b of an electrode is made from a conductive mesh of fine lines of conductive material (such as for example, carbon nanotubes, gold, aluminum, copper, silver, or copper- or silver-based material) or other conductive material, and the fine lines of conductive material occupies approximately 10% of the area of its shape in a hatched or other suitable pattern. As another example, the conductive mesh substantially covers an entire active area of the touch sensor 10. In particular embodiments, conductive material 24a-b is opaque. Although the fine lines of conductive material 24a-b are opaque, the combined optical transmissivity of electrodes formed using a conductive mesh is approximately 95% or higher, ignoring a reduction in transmittance due to other factors such as the substantially flexible substrate material 26. In other particular embodiments, the electrodes, tracking, and connection pads of the touch sensor are formed from conductive material 24a-b.

In certain embodiments, substrate 26 has connection pads 16a-b disposed on opposing sides of substrate 26, as shown in FIG. 8A. In certain embodiments, substrate 26 may have only a single connection pad 16 disposed on a surface of substrate 26, or may have three or more connection pads 16 disposed on a surface of substrate 26. This disclosure contemplates any suitable number of connection pads 16.

As described above, touch-sensor controller 12 may be disposed on an FPC, and the FPC may be bonded to connection pads 16a and/or 16b using ACF or ACP. One or more gaps 82 within mechanical stack 34f may facilitate electrically coupling an FPC and/or other suitable circuitry to connection pads 16 by providing a channel (e.g., channel 84) within mechanical stack 34f through which a portion of an FPC and/or other suitable circuitry may extend. In certain embodiments, gap 82a is formed by selectively removing portions of at least adhesive layers 22a-b, substrate 26, and dielectric layer 28, as shown in FIG. 8A. In particular embodiments, gap 82b is formed by selectively removing portions of at least adhesive layers 22b and dielectric layer 28, as shown in FIG. 8B. The selective removal of mechanical stack 34f to form 82a and 82b may be at least partially effected, for example, by sawing mechanical stack 34f along an axis shown by gaps 82a and 82b, respectively. In a particular embodiment, a die cut tool is used to selectively cut away portions of mechanical stack 34f and form one or more gaps 82; however, any gaps 82 may be formed using any suitable tool.

In a particular embodiment, the formation of gap 82a may facilitate access to connection pads 16a for bonding. During a bonding process, for example, an FPC may be inserted into gap 82a along the z-axis, guided through channel 82a, and then bonded to an outer surface of connection pads 16a. Additionally or alternatively, the FPC may be bonded to connection pads 16b. In particular embodiments, the formation of gap 82a may enable a portion 88 of mechanical stack 34f to be bent slightly (e.g., in direction of arrow 90), which may facilitate insertion of an FPC through channel 82. In certain embodiments, cover 20 may be coupled to adhesive layer 22a (e.g., by lamination) after completion of electrical bonding to connection pads 16a and/or connection pads 16b. Although multiple examples are provided herein, the coupling together of the various layers 20-30 mechanical stack 34f may occur in any suitable order.

Because substrate 26 has a thickness of 0.05 mm, the weight of the FPC or forces during bonding could place stress on substrate 26 (e.g., proximate the portion of mechanical stack 34 corresponding to connection pads 16a-b), which could bend substrate 26 beyond a threshold that might cause damage to or breaks in conductive material 24a-b. In particular embodiments, mechanical support may be provided to mechanical stack 34f in a manner that reduces the stress placed on substrate 26 during bonding. The mechanical support may be provided, at least in part, by conforming portions of adhesive layer 22 to the surfaces of substrate 26. The conformity of adhesive layers 22a-b to substrate 26 may include, for example, an extension of a portion of adhesive layers 22a-b beyond conductive material 24a-b and connection pads 16a-b in a longitudinal direction (e.g., in a direction along an x-y plane), as shown in FIGS. 8A and 8B. As another example, the conformity of adhesive layers 22a-b to substrate 26 may include an extension of adhesive layers 22a-b in a direction perpendicular to the longitudinal direction (e.g., in a direction along a y-z plane) and parallel to an axis including substrate 26 and connection pad 16a and/or connection pad 16b, as shown in FIGS. 8A and 8B. As yet another example, the conformity of adhesive layers 22a-b to substrate 26 may include an extension of adhesive layers 22a-b along an edge of and generally coplanar to substrate 26, as shown by the portion of gasket 80 defined by volume 86, such that adhesive layers 22a-b are joined together and form one continuous adhesive boundary. In alternative embodiments, however, volume 86 may be a continuous extension of substrate 26 that separates adhesive layer 22a from adhesive layer 22b, such that gasket 80 is formed in part by an edge of substrate 26.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
a cover panel having an inner surface;
a first adhesive layer coupled to the cover panel, a perimeter of the first adhesive layer forming at least a portion of a gasket seal extending substantially perpendicular to the inner surface of the cover panel, an inner surface of the gasket seal defining an edge of a channel;
a substrate coupled to the first adhesive layer, the substrate comprising an outer surface having disposed thereon a connection pad region and drive or sense electrodes, the drive or sense electrodes disposed between the substrate and the cover panel, at least a portion of the channel disposed between the gasket seal and the connection pad region; and a flexible printed circuit (FPC) electrically coupled by the connection pad region to the drive or sense electrodes, a first portion of the FPC extending through the channel in a direction substantially perpendicular to the inner surface of the cover panel and substantially parallel to the inner surface of the gasket seal.

2. The apparatus of claim 1, further comprising a second adhesive layer conforming to an inner surface of the substrate at a region opposite the connection pad region on the outer surface of the substrate, the inner and outer surfaces of the substrate being on opposite sides of the substrate with respect to each other.

3. The apparatus of claim 2, wherein the gasket seal comprises respective portions of the first and second adhesive layers.

4. The apparatus of claim 3, wherein the respective portions of the first and second adhesive layers are coupled to each other.

5. The apparatus of claim 2, wherein the first and second adhesive layers form one continuous adhesive layer.

6. The apparatus of claim 2, wherein the gasket seal comprises respective portions of the first adhesive layer, the substrate, and the second adhesive layer, the substrate being disposed between the first and second adhesive layers.

7. The apparatus of claim 6, wherein the channel extends through each of the first adhesive layer, the substrate, and the second adhesive layer.

8. The apparatus of claim 1, the substrate further comprising an inner surface having disposed thereon a connection pad region and drive or sense electrodes, the inner and outer surfaces of the substrate being on opposite sides of the substrate with respect to each other.

9. The apparatus of claim 8, wherein the first adhesive layer substantially fills a volume disposed between the cover panel and a portion of the outer surface of the substrate, the portion of the outer surface of the substrate and the connection pad region on the inner surface of the substrate being disposed on opposite sides of the substrate with respect to each other.

10. The apparatus of claim 8, wherein the FPC is electrically coupled by the connection pad region on the inner surface of the substrate to the drive or sense electrodes on the inner surface of the substrate.

11. The apparatus of claim 8, wherein a second FPC is electrically coupled by the connection pad region on the inner surface of the substrate to the drive or sense electrodes on the inner surface of the substrate.

12. The apparatus of claim 1, wherein a second portion of the FPC is bonded to the connection pad region on the outer surface of the substrate.

13. The apparatus of claim 12, wherein the FPC comprises a bend such that the first and second portions of the FPC are at substantially right angles with respect to each other.

14. The apparatus of claim 1, wherein the inner surface of the cover panel and the inner surface of the gasket seal are each substantially disposed along respective planes that are substantially perpendicular with respect to each other.

15. The apparatus of claim 1, wherein the first adhesive layer comprises an optically clear adhesive (OCA).

16. A method comprising:
forming a connection pad region and drive or sense electrodes on an outer surface of a substrate;
forming a connection pad region and drive or sense electrodes on an inner surface of the substrate;
adhering a first adhesive layer to the outer surface of the substrate;
adhering a second adhesive layer to the inner surface of the substrate;
forming a channel extending in a direction substantially perpendicular to the inner and outer surfaces of the substrate, at least in part, by cutting away selective portions of the substrate and the first and second adhesive layers;
inserting a portion of a flexible printed circuit (FPC) into the channel formed, at least in part, by selectively removing portions of the substrate and the first and second adhesive layers;
bending the FPC, such that a first portion of the FPC is disposed outwardly from the connection pad region formed on the outer surface of the substrate and a second portion of the FPC is disposed within the channel; and
electrically coupling the FPC to the drive or sense electrodes formed on the outer surface of the substrate, at least in part, by bonding the FPC to the connection pad region formed on the outer surface of the substrate.

17. The method of claim 16, wherein selectively removing portions of the substrate and the first and second adhesive layers comprises cutting through the substrate and the first and second adhesive layers.

18. The method of claim 16, further comprising coupling a cover panel to the first adhesive layer using adhesion of the first adhesive layer.

19. The method of claim 16, further comprising electrically coupling the FPC to the drive or sense electrodes formed on the inner surface of the substrate, at least in part, by bonding the FPC to the connection pad region formed on the inner surface of the substrate.

20. An apparatus comprising:
a cover panel having an inner surface;
a first optically clear adhesive layer coupled to the cover panel,
a substrate coupled to the first adhesive layer, the substrate comprising:
an outer surface having disposed thereon a first connection pad region and first drive or sense electrodes, the drive or sense electrodes disposed between the substrate and the cover panel;
an inner surface having disposed thereon a second connection pad region and second drive or sense electrodes, the outer and inner surfaces of the substrate being on opposite sides of the substrate with respect to each other;
a second adhesive layer coupled to the inner surface of the substrate;
a dielectric layer coupled to the second adhesive layer; and
a flexible printed circuit (FPC) electrically coupled by the first connection pad region to the first drive or sense electrodes;
wherein respective portions of the first adhesive layer, the substrate, the second adhesive layer, and the dielectric layer collectively form a gasket seal around a perimeter of the cover panel, the gasket seal extending in a direction away from the cover panel along an axis substantially perpendicular to the outer and inner surfaces of the substrate, an inner surface of the gasket seal defining an edge of a channel; and
wherein a portion of the FPC is disposed within the channel and extends through respective openings in each of the first adhesive layer, the substrate, the second adhesive layer, and the dielectric layer.

* * * * *